United States Patent [19]
Kogure et al.

[11] Patent Number: 5,337,467
[45] Date of Patent: Aug. 16, 1994

[54] METHOD OF PRODUCING WIRE-BONDED SUBSTRATE ASSEMBLY

[75] Inventors: Seiji Kogure; Mamoru Niishiro, both of Kawasaki, Japan

[73] Assignee: Fujitsu Limited, Kawasaki, Japan

[21] Appl. No.: 797,128

[22] Filed: Nov. 22, 1991

[30] Foreign Application Priority Data

Nov. 28, 1990 [JP] Japan ................... 2-328428

[51] Int. Cl.[5] ............................................. H05K 3/34
[52] U.S. Cl. ......................... 29/840; 29/832; 269/901; 439/84
[58] Field of Search ............... 29/840, 566.3; 439/84; 269/901

[56] References Cited

U.S. PATENT DOCUMENTS

| | | | |
|---|---|---|---|
| 4,187,751 | 2/1980 | Barnacle | 29/566.3 X |
| 4,640,010 | 2/1987 | Brown | 29/840 X |
| 4,841,633 | 6/1989 | Kinugawa | 29/847 X |
| 5,054,193 | 10/1991 | Ohms et al. | 29/832 X |
| 5,144,535 | 9/1992 | Megens et al. | 439/84 X |
| 5,155,904 | 10/1992 | Majd | 29/837 |

FOREIGN PATENT DOCUMENTS

| | | |
|---|---|---|
| 59-4132 | 1/1984 | Japan . |
| 60-100496 | 6/1985 | Japan . |
| 61-287131 | 12/1986 | Japan . |
| 62-291156 | 12/1987 | Japan . |

*Primary Examiner*—Carl J. Arbes

[57] ABSTRACT

A wire-bonded substrate assembly is made up of a substrate having a first surface and a second surface which is opposite to the first surface, and a plurality of elements mounted on the first and second surfaces of the substrate. The elements at least include resin encapsulated integrated circuit chips which are wire-bonded and encapsulated by a synthetic resin. A first one of the resin encapsulated integrated circuit chips is mounted at a first region on the first surface of the substrate, while a second one of the resin encapsulated integrated circuit chips is mounted at a second region on the second surface of the substrate. The second region is other than a region on the second surface opposite to the first region on the first surface.

9 Claims, 12 Drawing Sheets

METHOD OF PRODUCING WIRE-BONDED SUBSTRATE ASSEMBLY

BACKGROUND OF THE INVENTION

The present invention generally relates to wire-bonded substrate assemblies and methods of producing the same, and more particularly to a wire-bonded substrate assembly which is wire-bonded on both sides of the substrate and a method of producing such a wire-bonded substrate assembly.

In order to reduce the size of the substrate assembly, the chip-on-board method is employed to mount an integrated circuit (IC) chip directly on the substrate. But there are now demands to reduce the size of the substrate assembly so as to enable further improvement in the integration density.

FIG. 1 shows an example of a conventional wire-bonded substrate assembly. A wire-bonded substrate assembly 1 shown in FIG. 1 is made up of a substrate 2 having a surface 3. IC chips 4 and 5 and a capacitor 6 are mounted on the surface 3. The IC chips 4 and 5 respectively have wires 7 and 8 bonded thereon. The wire-bonded IC chips 4 and 5 are respectively encapsulated by synthetic resins 9 and 10.

The wires 7 and 8 are bonded by placing the substrate 2 on a flat work table 12 which has a built-in heater 11, and using an ultrasonic bonding tool (not shown) while heating the substrate 2 from its bottom by the heater 11.

According to the wire-bonded substrate assembly 1, the IC chips 4 and 5 are mounted on only the surface 3 of the substrate 2. For this reason, there is a limit to improving the mounting density and it is difficult to further reduce the size of the wire-bonded substrate assembly 1.

In order to solve the problem of the wire-bonded substrate assembly 1 described above, it is conceivable to mount IC chips on the other surface 13 of the substrate 2. However, if the substrate 2 is placed on the word table 12 with the surface 3 facing down as shown in FIG. 2, the substrate 2 is in effect supported by the synthetic resins 9 and 10 and a gap 14 is inevitably formed between the substrate 2 and the top of the work table 12. In FIG. 2, those parts which are the same as those corresponding parts in FIG. 1 are designated by the same reference numerals, and a description thereof will be omitted.

As a result, a bonding part of the substrate 2 on the surface 13 where the wire-bonding is to be made cannot be heated satisfactorily by the heater 11 due to the existence of the gap 14, and the ultrasonic waves applied to this bonding part by the ultrasonic bonding tool cannot be concentrated at the bonding part. Instead, the ultrasonic waves tend to propagate to the parts surrounding the bonding part. In addition, the substrate 2 on the work table 12 is supported by the synthetic resins 9 and 10, and the support of the substrate 2 is not sufficiently stable. For the above described reasons, there is a problem in that the ultrasonic wire-bonding cannot be made stably. Accordingly, it was conventionally impossible to mount IC chips on both the surfaces 3 and 13 of the substrate 2 by the wire-bonding.

SUMMARY OF THE INVENTION

Accordingly, it is a general object of the present invention to provide a novel and useful wire-bonded substrate assembly and a method of producing the same, in which the above described problem is eliminated.

Another and more specific object of the present invention is to provide a wire-bonded substrate assembly comprising a substrate having a first surface and a second surface which is opposite to the first surface, and a plurality of elements mounted on the first and second surfaces of the substrate, where the elements at least include resin encapsulated integrated circuit chips which are wire-bonded and encapsulated by a synthetic resin, a first one of the resin encapsulated integrated circuit chips is mounted at a first region on the first surface of the substrate, a second one of the resin encapsulated integrated circuit chips is mounted at a second region on the second surface of the substrate, and the second region is other than a region on the second surface opposite to the first region on the first surface. According to the wire-bonded substrate assembly of the present invention, the integration density can be greatly improved and the size of the wire-bonded substrate assembly can be reduced when compared to the conventional wire-bonded substrate assembly having the same number of elements mounted on only one surface of the substrate.

Still another object of the present invention is to provide a method of producing a substrate assembly comprising the steps of (a) preparing a semi-completed substrate assembly which is made up of a substrate having a first surface and a second surface which is opposite to the first surface, and a plurality of elements mounted on the first surface of the substrate, (b) supporting the first surface of the substrate at positions avoiding positions of the elements mounted on the first surface, and (c) carrying out a process on the second surface of the substrate to complete a substrate assembly. According to the method of the present invention, it is possible to carry out the process with respect to the second surface of the substrate in a satisfactory manner because the first surface of the substrate is supported in a stable manner. The method is effective particularly when the process involves a wire-bonding.

A further object of the present invention is to provide a work table for supporting a semi-completed substrate assembly which is made up of a substrate having a first surface and a second surface which is opposite to the first surface, and a plurality of elements mounted on the first surface of the substrate, which work table comprises a plurality of blocks movable between raised and lowered positions and having flat supporting surfaces, elevator means, coupled to the blocks, for driving the blocks between the raised and lowered positions, and control means, coupled to the elevator means, for controlling the elevator means so that selected ones of the blocks in the raised positions support the first surface of the substrate at positions avoiding positions of the elements mounted on the first surface. According to the work table of the present invention, it is possible to stably support the first surface of the substrate, and the work table is particularly suited for carrying out a wire-bonding process with respect to the second surface of the substrate.

Other objects and further features of the present invention will be apparent from the following detailed description when read in conjunction with the accompanying drawings.

DESCRIPTION OF THE PREFERRED EMBODIMENTS

Figure 1:
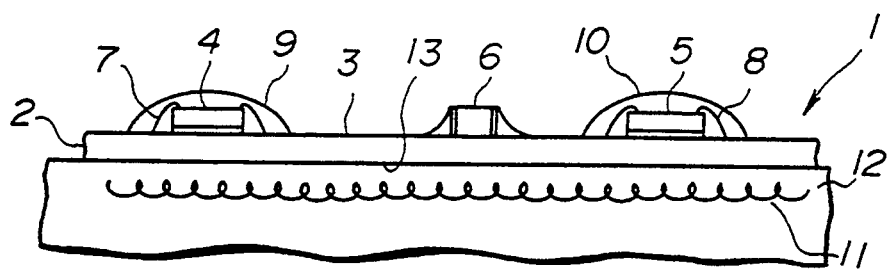
FIG. 1 is a cross sectional view showing an example of a conventional wire-bonded substrate assembly together with a work table.
Figure 2:
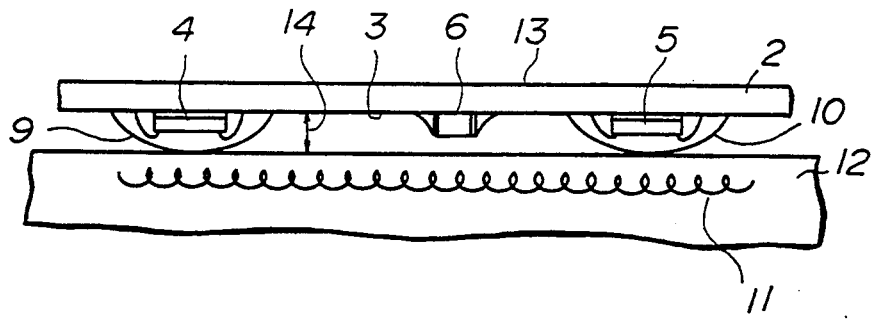
FIG. 2 is a cross sectional view for explaining a conceivable method of mounting IC chips on both surfaces of a substrate of the wire-bonded substrate assembly.
Figure 3:
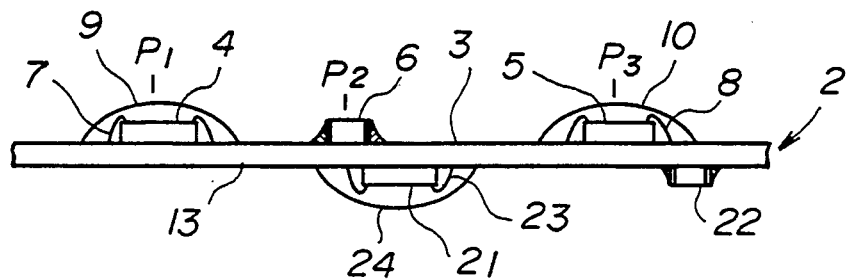
FIG. 3 is a cross sectional view showing an embodiment of a wire-bonded substrate assembly according to the present invention.

A description will be given of an embodiment of a wire-bonded substrate assembly according to the present invention, by referring to FIG. 3. In FIG. 3, those parts which are basically the same as those corresponding parts in FIGS. 1 and 2 are designated by the same reference numerals, and a description thereof will be omitted.

A wire-bonded substrate assembly 20 shown in FIG. 3 is made up of a substrate 2 having surfaces 3 and 13. IC chips 4 and 5 and a capacitor 6 are mounted on the surface 3 of the substrate 2. The IC chips 4 and 5 respectively have wires 7 and 8 bonded thereon by ultrasonic wire-bonding, and respectively are encapsulated by synthetic resins 9 and 10. On the other hand, an IC chip 21 and a capacitor 22 are mounted on the surface 13 of the substrate 2. The IC chip 21 has wires 23 bonded thereon by ultrasonic wire-bonding, and is encapsulated by a synthetic resin 24.

According to the wire-bonded substrate assembly 20, both the surfaces 3 and 13 of the substrate 2 are used as mounting surfaces for the IC chips. As a result, the integration density becomes approximately twice that of the conventional wire-bonded substrate assembly, and the size of the wire-bonded substrate assembly 20 can be reduced compared to the conventional wire-bonded substrate assembly having the same number of IC chips mounted thereon.

Next, a description will be given of a first embodiment of a method of producing the wire-bonded substrate assembly 20 according to the present invention. This embodiment of the method employs a work table 30 shown in FIG. 4.

Figure 5:
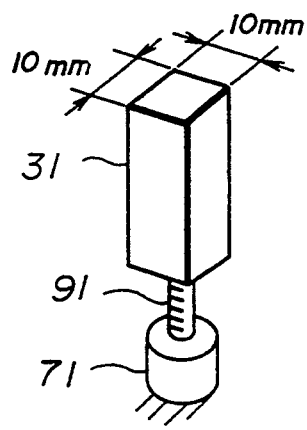
FIG. 5 is a perspective view showing a block and a motor shown in FIG. 4.

The work table 30 generally includes blocks 31 through 47, heaters 51 through 67, motors 71 through 87, feed screws 91 through 107, and motor driving circuits 111 through 127. The blocks 31 through 47 each have a top surface which has the size of 10 mm × 10 mm as shown in FIG. 5, for example, but the top surface of each block is not limited to the rectangular shape. The heaters 51 through 67 are built-in in the vicinity of the top surface of the corresponding blocks 31 through 47. The motors 71 through 87 are provided on a base 88 in correspondence with the blocks 31 through 47. The feed screws 91 through 107 correspond to rotary shafts of the motors 71 through 87, and make meshing engagement with the corresponding blocks 31 through 47. Hence, the blocks 31 through 47 move up and down when the feed screws 91 through 107 are rotated by the respective motors 71 through 87. The motor driving circuits 111 through 127 drive the corresponding motors 71 through 87. The motors 71 through 87, the feed screws 91 through 107, and the motor driving circuits 111 through 127 form a block elevator mechanism 130.

Figure 4:
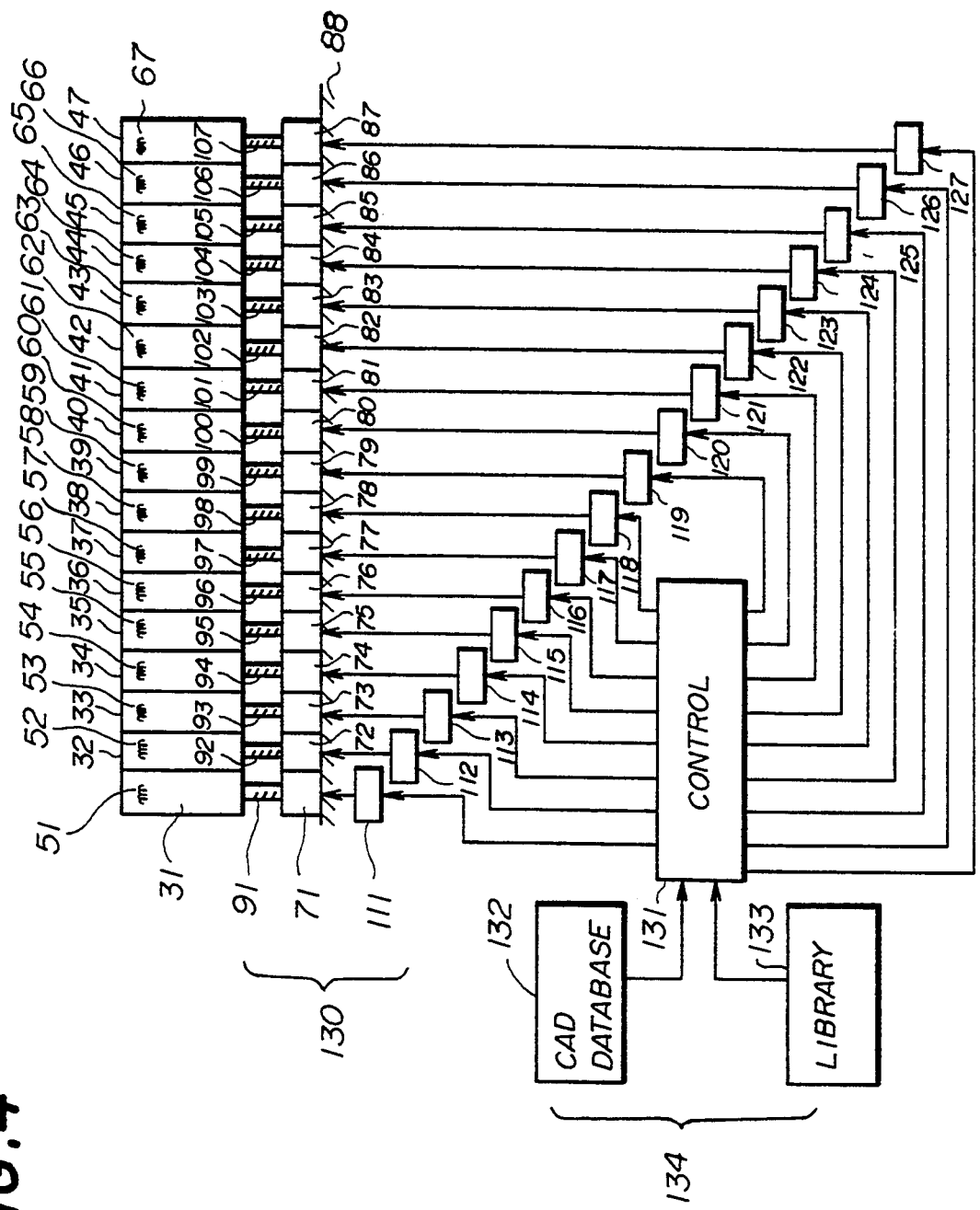
FIG. 4 is a system block diagram showing an embodiment of a work table which is used in a first embodiment of a method of producing the wire-bonded substrate assembly according to the present invention.

Only the blocks 31 through 47 are shown in FIG. 4 for the sake of convenience in order to simplify the description, but the work table 30 may be made up of blocks which are arranged in an array. In other words, the blocks forming the work table 30 may be arranged in a matrix arrangement. However, depending on the layout of the elements mounted on the substrate 2, the blocks may have elongated top surfaces in which case the blocks may be arranged in a one-dimensional array. Preferably, the blocks are arranged in the matrix arrangement to enable fine adjustments depending on the layout of the elements mounted on the substrate 2.

A control circuit 131 controls the motor driving circuits 111 through 127. A computer aided design (CAD) database 132 and a library 133 are coupled to the control circuit 131. The CAD database 132 stores various data including data related to positions P1, P2 and P3 of the IC chips 4 and 5 and the capacitor 6 on the surface 3 of the substrate 2. On the other hand, the library 133 stores various data including data related to the shapes of the IC chips 4 and 5 and the capacitor 6 which are mounted on the surface 3 of the substrate 2. The control circuit 131 selects and drives predetermined ones of the motor driving circuits 111 through 127 based on the data which are received from the CAD database 132 and the library 133. The control circuit 131, the CAD database 132 and the library 133 form a control means 134.

The above described work table 30 is used to produce the wire-bonded substrate assembly 20 shown in FIG. 3 in the following manner.

The mounting of the IC chips 4 and 5 and the capacitor 6 on the surface 3 of the substrate 2, the wire-bonding of the wires 7 and 8, and the encapsulation by the synthetic resins 9 and 10 are carried out on the work table 30 similarly as in the conventional case described in conjunction with FIG. 1 using the work table 12.

Figure 6:
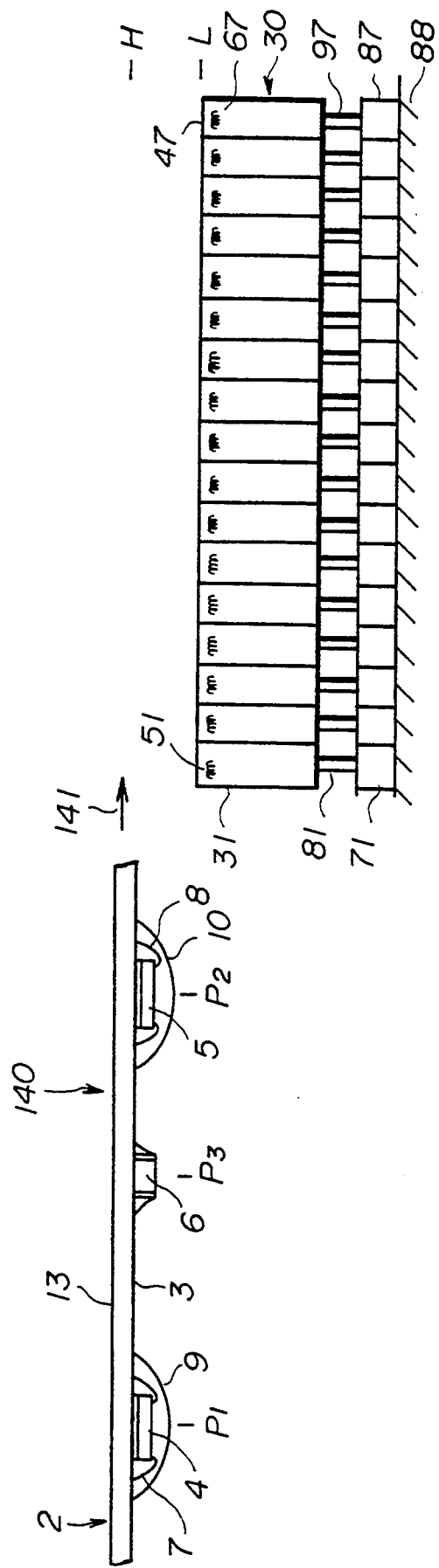
FIG. 6 is a cross sectional view showing a semi-completed substrate assembly which is transported towards a work table in the first embodiment of the method.

When the processes with respect to the surface 3 of the substrate 2 end, the substrate 2 becomes a semi-completed substrate assembly 140 shown in FIG. 6. For example, the semi-completed substrate assembly 140 is turned upsidedown so that the surface 13 faces up, and is transported in a direction indicated by an arrow 141 in FIG. 6 under guidance of guide rails (not shown). The semi-completed substrate assembly 140 is thus supported and transported horizontally to a position above the work table 30.

For example, a belt drive mechanism (not shown) may be used as a transport means for transporting the semi-completed substrate assembly 140. In this case, a belt of the belt drive mechanism has an opening for exposing the substrate 2 on the side of the surface 3, and the substrate 2 is supported by parts of the belt defining the opening. It is not essential to provide the above mentioned guide rails in this case.

While the semi-completed substrate assembly 140 is being transported, all of the blocks 31 through 47 are located at lowered positions L shown in FIG. 6 so as not to interfere with the transport of the semi-completed substrate assembly 140.

When the semi-completed substrate assembly 140 reaches a position immediately above the work table 30 and is stopped by a stopper (not shown), the control circuit 131 receives from the CAD database 132 the data related to the positions P1, P2 and P3 of the IC chips 4 and 5 and the capacitor 6, and the control circuit 131 also receives from the library 133 the data related to the shapes of the IC chips 4 and 5 and the capacitor 6. Based on the data received from the CAD database 132 and the library 133, the control circuit 131 supplies a control signal to the motor driving circuits 111, 116, 117, 118, 122 and 127 out of the motor driving circuits 111 through 127.

The motor driving circuits 111, 116, 117, 118, 122 and 127 are operated in response to the control signal and drive the corresponding motors 71, 76, 77, 78, 82 and 87. As a result, the feed screws 91, 96, 97, 98, 102 and 107 rotate and raise the corresponding blocks 31, 36, 37, 38, 42 and 47 to raised positions H shown in FIG. 7. The raised blocks 31, 36, 37, 38, 42 and 47 make contact with the surface 3 of the substrate 2 of the semi-completed substrate assembly 140 at parts avoiding the synthetic resins 9 and 10 and the capacitor 6. Hence, the semi-completed substrate assembly 140 is supported firmly and stably by the raised blocks 31, 36, 37, 38, 42 and 47 in a state where no unwanted gap is formed between the work table 30 and the surface 3 of the substrate 2. Furthermore, the substrate 2 can be heated satisfactorily by the heaters 51, 56, 57, 58, 62 and 67 in this state where the semi-completed substrate assembly 140 is supported by the raised blocks 31, 36, 37, 38, 42 and 47.

Figure 8:
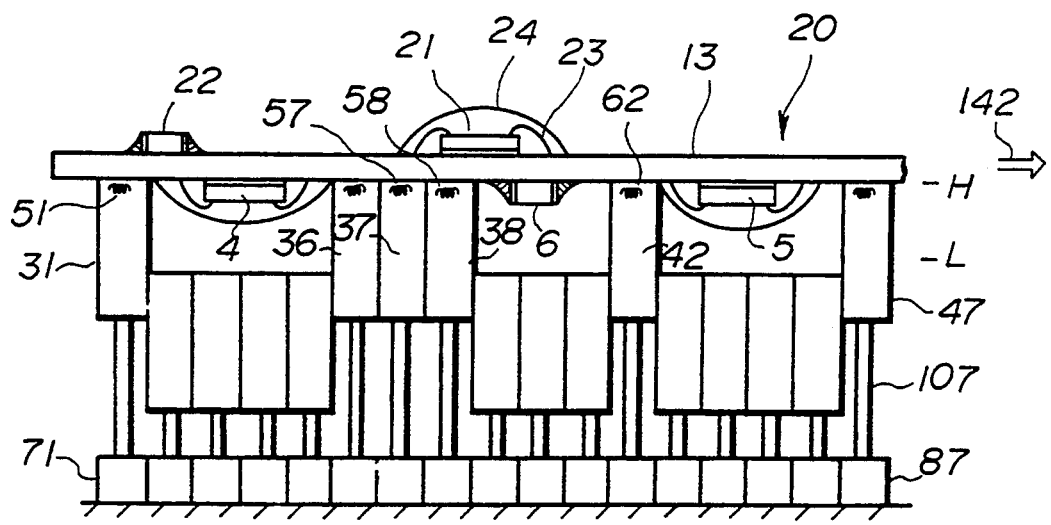
FIG. 8 is a cross sectional view for explaining a process of mounting elements on the other surface of the substrate in the first embodiment of the method.

The IC chip 21 and the capacitor 22 are die-bonded on the surface 13 of the substrate 2 as shown in FIG. 8 in the above described state where the semi-completed substrate assembly 140 is supported by the raised blocks 31, 36, 37, 38, 42 and 47. As for the IC chip 21, the wires 23 are wire-bonded thereon by ultrasonic wire-bonding and the IC chip 21 is thereafter encapsulated by the synthetic resin 24. Bonding parts of the substrate 2 which is subjected to the ultrasonic wire-bonding are heated by the heaters 57, 58 and 62. In addition, the raised blocks 36, 37, 38 and 42 positively support the bonding parts of the substrate 2 without any unnecessary gap between the substrate 2 and the work table 30. Therefore, the ultrasonic wire-bonding of the wires 23 can be made stably, and the bonding of the wires 23 can be made satisfactorily. Furthermore, the die-bonding and the resin encapsulation can both be made satisfactorily, particularly because of the stable support of the substrate 2.

Figure 7:
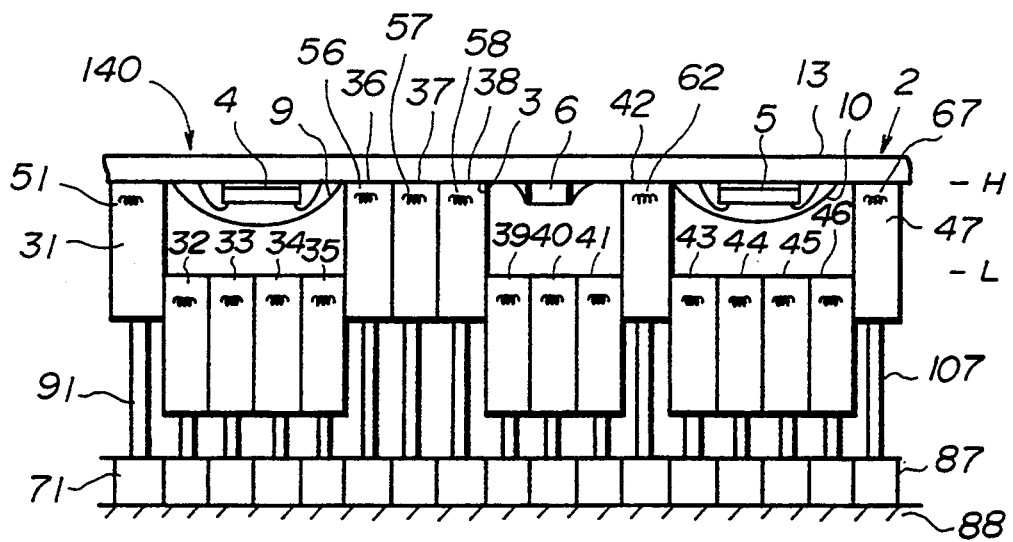
FIG. 7 is a cross sectional view showing the semi-completed substrate assembly which is supported by raised blocks in the first embodiment of the method.

As may be seen from FIGS. 7 and 8, the blocks 32, 33, 34, 35, 39, 40, 41, 43, 44, 45 and 46 which confront the parts of the substrate 2 where the IC chips 4 and 5 and the capacitor 6 are mounted are separated from the IC chips 4 and 5 and the capacitor 6 because the blocks 32, 33, 34, 35, 39, 40, 41, 43, 44, 45 and 46 are at the lowered positions L. For this reason, no unwanted stress is applied to the IC chips 4 and 5 and the capacitor 6, and the IC chips 4 and 5 and the capacitor 6 are protected from being damaged by the blocks when carrying out processes with respect to the surface 13 of the substrate 2. Therefore, the wire-bonded substrate assembly 20 having elements mounted on both surfaces 3 and 13 of the substrate 2 can be produced in a normal manner.

In the above described case, the blocks 31, 36, 37, 38, 42 and 47 are lowered to the lowered positions L after the wire-bonding or the resin encapsulation, and the completed wire-bonded substrate assembly 20 is transported in a direction of an arrow 142 by the transport means described above, for example, to the next stage of production if any.

Figure 9:
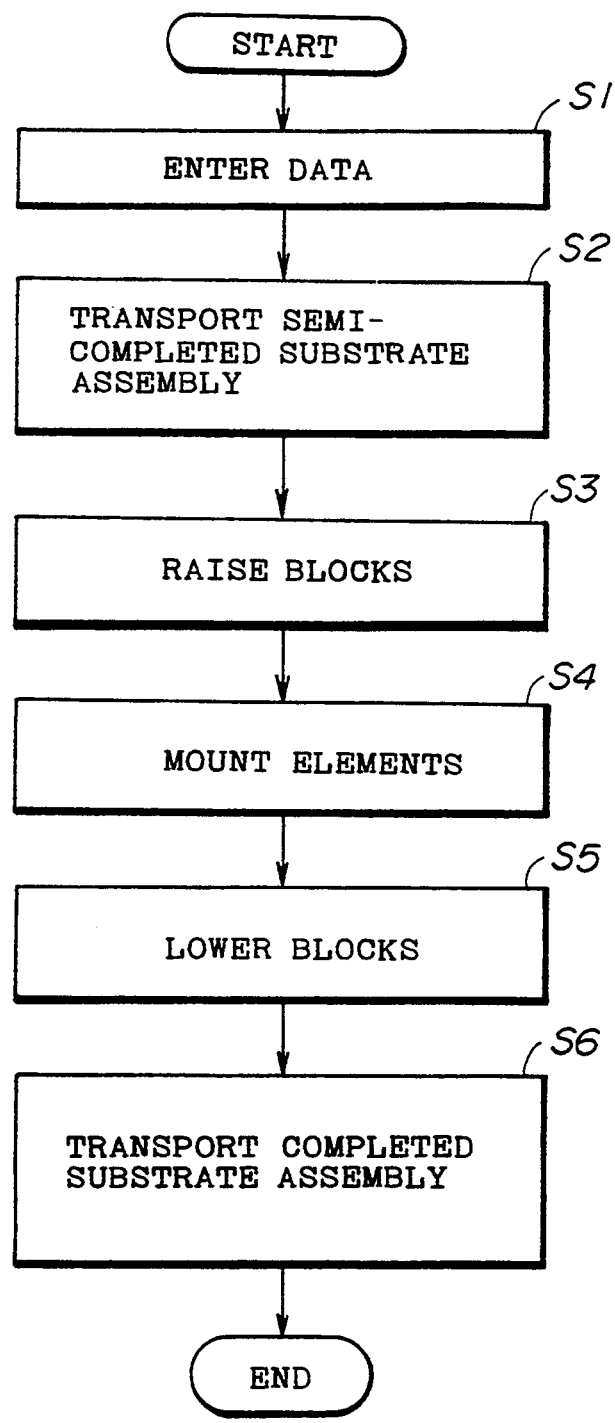
FIG. 9 is a flow chart for explaining the first embodiment of the method.

FIG. 9 generally shows the basic steps of the first embodiment of the method. The process shown in FIG. 9 is started by the control circuit 131 after the elements are mounted on the surface 3 of the substrate 2 and the semi-completed substrate assembly 140 is obtained, if it is assumed for the sake of convenience that the control circuit 131 forms a controller (not shown) which controls the entire process of producing the wire-bonded substrate assembly 20. However, if not, only steps S1, S3 and S5 are carried out by the control circuit 131 and other steps S2, S4 and S6 are carried out by the controller.

In FIG. 9, the step S1 enters the data from the CAD database 132 and the library 133. The step S2 transports the semi-completed substrate assembly 140 to the position immediately above the work table 30. The step S3 raises the selected ones of the blocks 31 through 47 so that the selected blocks support the surface 3 of the substrate 2 at parts avoiding parts where elements are mounted on the surface 3. The step S4 mounts elements on the surface 13 of the substrate 2. The mounting of the elements on the surface 13 includes the wire-bonding process. After the elements are mounted on the surface 13 of the substrate 2, the step S5 lowers the raised blocks and the step S6 transports the completed wire-bonded substrate assembly 20 to the next stage.

In the first embodiment of the method, the semi-completed substrate assembly 140 is transported horizontally towards the work table 30. However, the semi-completed substrate assembly 140 may be transported vertically towards the work table 30.

Figure 10:
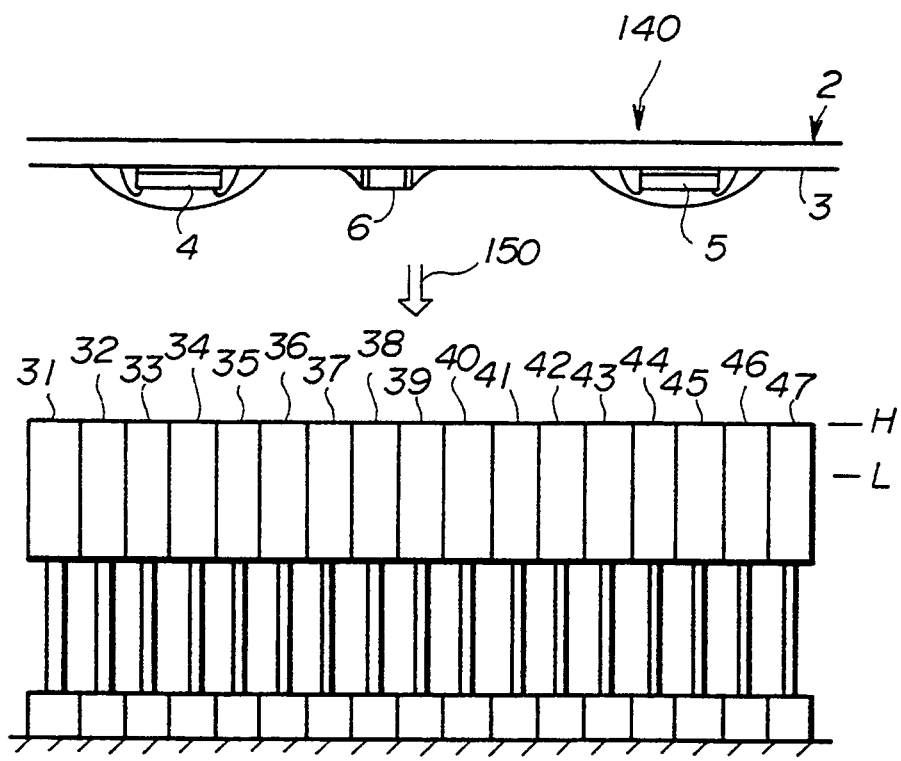
FIG. 10 is a cross sectional view showing a semi-completed substrate assembly which is transported towards a work table for explaining a second embodiment of the method of producing the wire-bonded substrate assembly according to the present invention.
Figure 11:
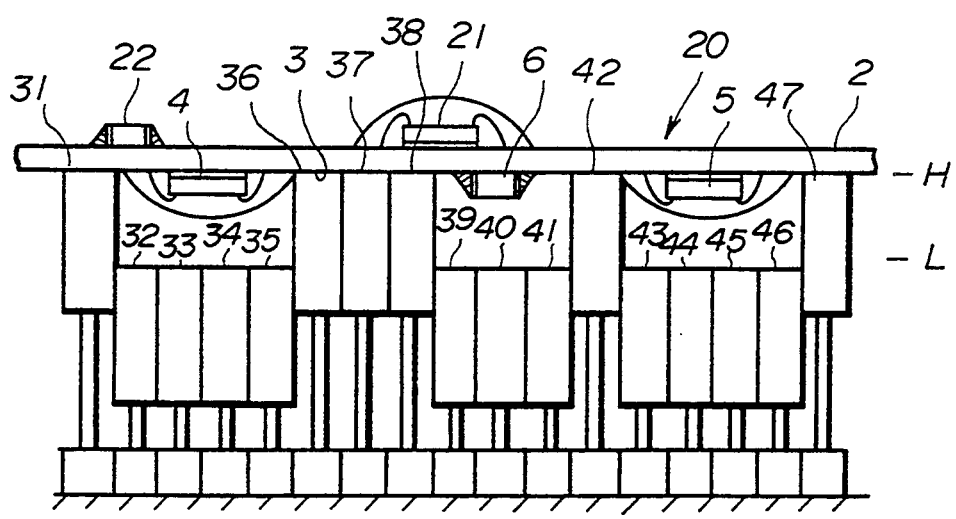
FIG. 11 is a cross sectional view for explaining a process of mounting elements on the other surface of the substrate in the second embodiment of the method.

Next, a description will be given of a third embodiment of the method of producing the wire-bonded substrate assembly according to the present invention, in which the semi-completed substrate assembly 140 is transported downwardly in a direction of an arrow 150 in FIG. 10. In FIGS. 10 and 11, those parts which are the same as those corresponding parts in FIGS. 3 through 8 are designated by the same reference numerals, and a description thereof will be omitted.

Initially, all of the blocks 31 through 47 of the work table 30 are at the raised positions H as shown in FIG. 10. As the semi-completed substrate assembly 140 is transported downwardly onto the work table 30, the blocks 32 through 35 confronting the IC chip 4, the blocks 39 through 41 confronting the capacitor 6 and the blocks 43 through 46 confronting the IC chip 5 are lowered to the positions L under the control of the control circuit 131. As a result, the remaining blocks 31, 36 through 38, 42 and 47 which remain at the initial raised positions H support the surface 3 of the substrate 2 of the semi-completed substrate assembly 140.

Thereafter, the elements are mounted on the surface 13 of the semi-completed substrate assembly 140 as shown in FIG. 11, in a manner identical to that of the first embodiment of the method.

The basic steps of the second embodiment of the method are basically the same as those shown in FIG. 9 described above, except for the directions in which the semi-completed substrate assembly 140 and the completed wire-bonded substrate assembly 20 are transported.

Next, a description will be given of a third embodiment of the method of producing the wire-bonded substrate assembly according to the present invention. In this embodiment, each block of the work table is provided with a sensor for sensing the elements mounted on the substrate upon contact, and the block is lowered automatically when its sensor makes contact with the element of the substrate. This embodiment does not require a complex control system for controlling the up and down movement of the blocks.

Figure 12:
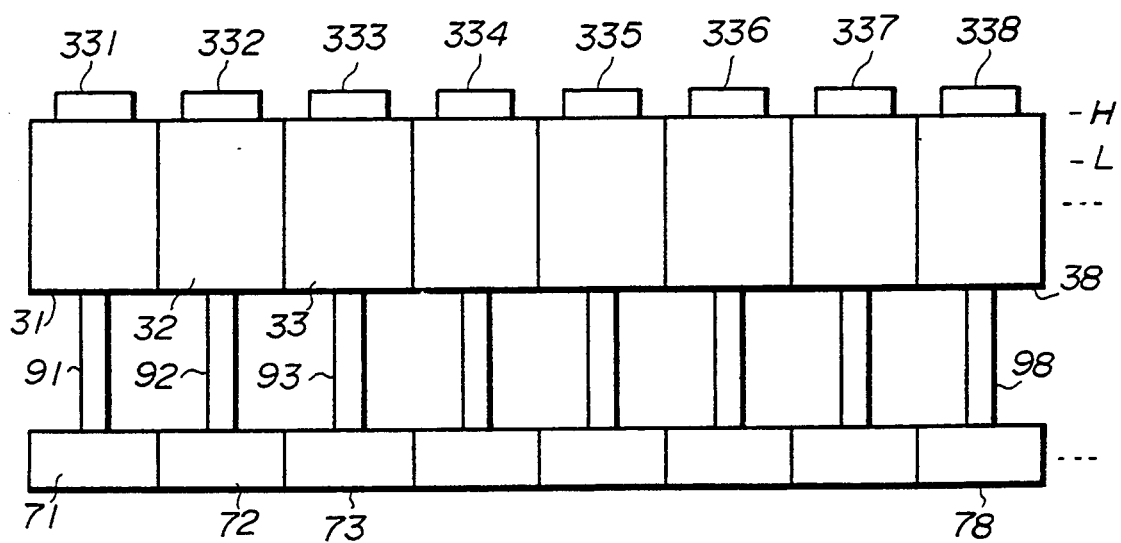
FIG. 12 is a side view showing an essential part of a work table used in a third embodiment of the method of producing the wire-bonded substrate assembly according to the present invention.
Figure 14:
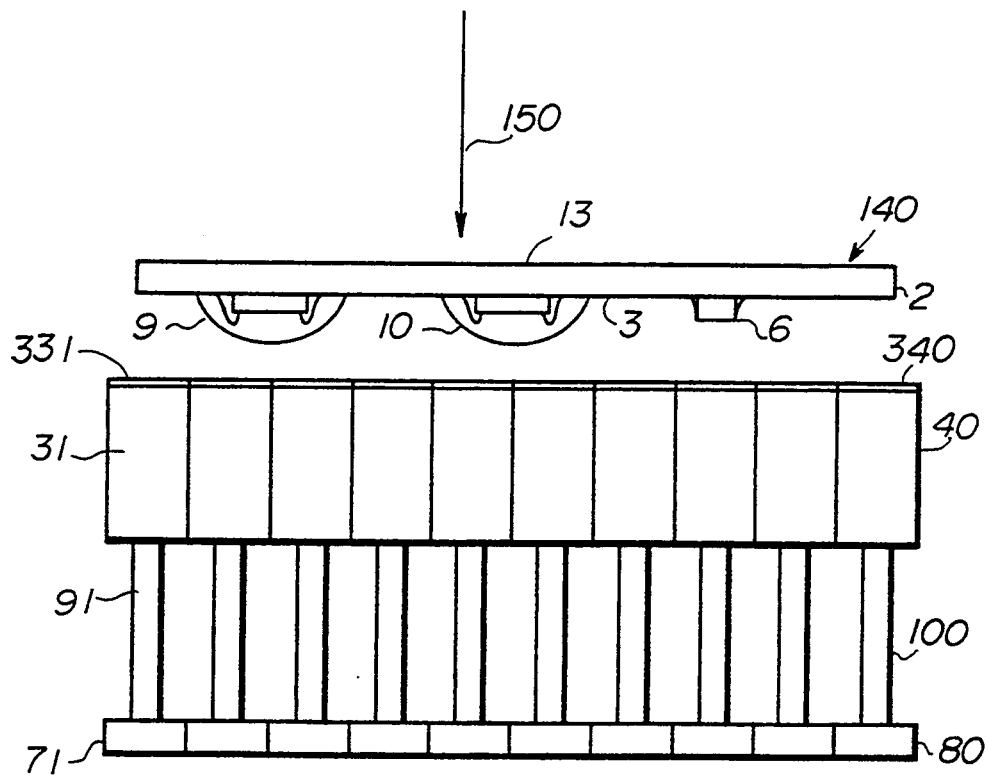
FIG. 14 is a cross sectional view showing a semi-completed substrate assembly which is transported towards a work table in the third embodiment of the method.
Figure 15:
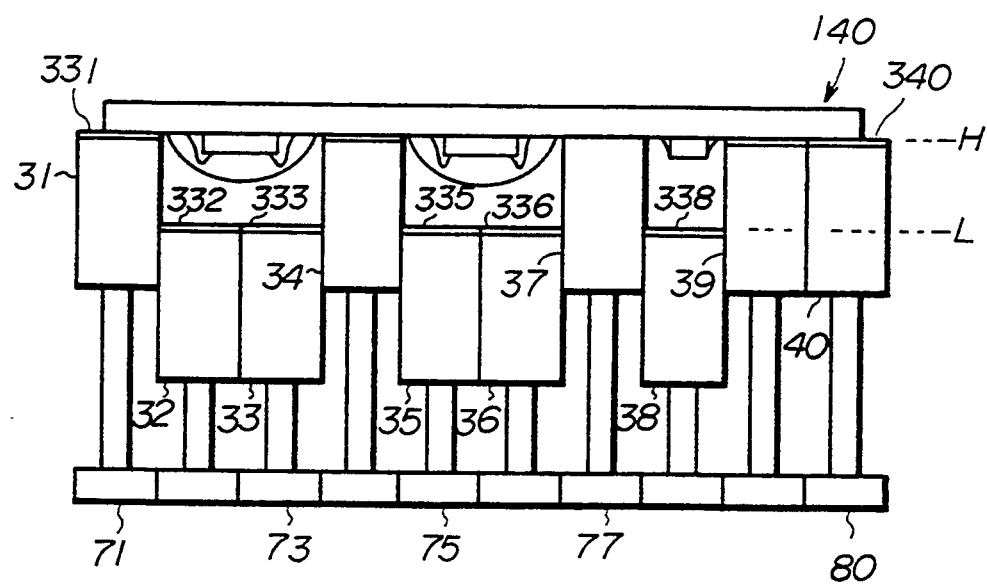
FIG. 15 is a cross sectional view showing the semi-completed substrate assembly which is supported by blocks which remain at initial positions in the third embodiment of the method.

FIG. 12 shows an essential part of a work table 330 which is used in this embodiment. In FIG. 12 and FIGS. 14 and 15 which will be described later, those parts which are basically the same as those corresponding parts in FIGS. 3 through 8, 10 and 11 are designated by the same reference numerals, and a description thereof will be omitted.

As shown in FIG. 12, the blocks 31 through 38 are respectively provided with sensors 331 through 338 on top surfaces thereof. The sensors 331 through 338 are contact sensors which output a sensor signal when a pressure applied thereon exceeds a predetermined pressure. In this embodiment, the control circuit 131 shown in FIG. 4 is coupled to each of the sensors 331 through 338. Hence, this control circuit 131 automatically rotates the motor 71 in a forward direction via the motor driving circuit 111 to lower the corresponding block 31 to a lowered position L in response to the sensor signal which is output from the sensor 331 when the sensor 331 senses the predetermined pressure, and turns OFF the motor 71 when the block 31 reaches the lowered position L. After transporting the completed wire-bonded substrate assembly 20, the motor 71 is rotated in a reverse direction by the control circuit 131 to raise the corresponding block 31 to a raised position H and is turned OFF when the block 31 reaches the raised position H.

In FIG. 12, the illustration of the control circuit 131 and the motor driving circuits 111 through 118 will be omitted because the connections are basically the same as those shown in FIG. 4, except that the sensors 331 through 338 are coupled to the control circuit 131 and the CAD database 132 and the library 133 shown in FIG. 4 are not required.

In order to prevent unwanted blocks from being lowered erroneously, it is possible to activate the sensors 331 through 338 only during a predetermined time from a time when one of the sensors 331 through 338 first senses contact with an element of the substrate 2. In this case, each of the motors 71 through 78 may be controlled to rotate in the forward direction until the corresponding blocks 31 through 38 reach the lowered positions L once the control circuit 131 receives the sensor signal from the corresponding sensors 331 through 338.

Figure 13A:
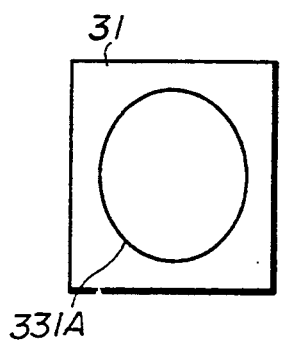
FIGS. 13A and 13B respectively are plan views showing a block and its sensor.
Figure 13B:
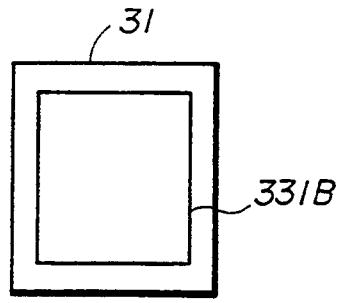

FIGS. 13A and 13B show embodiments of the sensor provided on the top of the block 31. FIG. 13A shows a sensor 331A having a circular sensor area, and FIG. 13B shows a sensor 31B having a rectangular sensor area. Because the block 331 has the built-in heater 51 and is heated thereby, the sensors 331A and 331B are heat resistant. The shapes of the sensor area and the top surface of the block 331 may be selected arbitrarily as long as the surface of the substrate 2 can be supported by a flat top surface of the block 31. The sensors 331A and 331B may be used as the sensors of the other blocks 32 through 38.

The semi-completed substrate assembly 140 is transported in the direction of the arrow 150 towards the work table 330 as shown in FIG. 14. In this case, the synthetic resin 9 makes contact with the sensors 332 and 333 of the blocks 32 and 33, the synthetic resin 10 makes contact with the sensors 335 and 336 of the blocks 35 and 36, and the capacitor 6 makes contact with the sensor 338 of the block 38. As a result, the motors 72, 73, 75, 76 and 78 are rotated in the forward direction by the control circuit 131 based on the sensor signals from the sensors 332, 333, 335, 336 and 338, and the corresponding blocks 32, 33, 35, 36 and 38 are lowered from the initial raised positions H to the lowered positions L. On the other hand, the sensors 331, 334, 337, 339 and 340 are not contacted within a predetermined time from the time when the sensors 335 and 336, for example, are first contacted by the synthetic resin 10. Hence, the blocks 31, 34, 37, 38 and 40 remain at the initial raised positions H to stably support the surface 3 of the substrate 2 of the semi-completed substrate assembly 140.

Thereafter, the elements are mounted on the surface 13 of the substrate 2 as in the case of the first and second embodiments of the methods described with reference to FIGS. 8 and 11.

Figure 16:
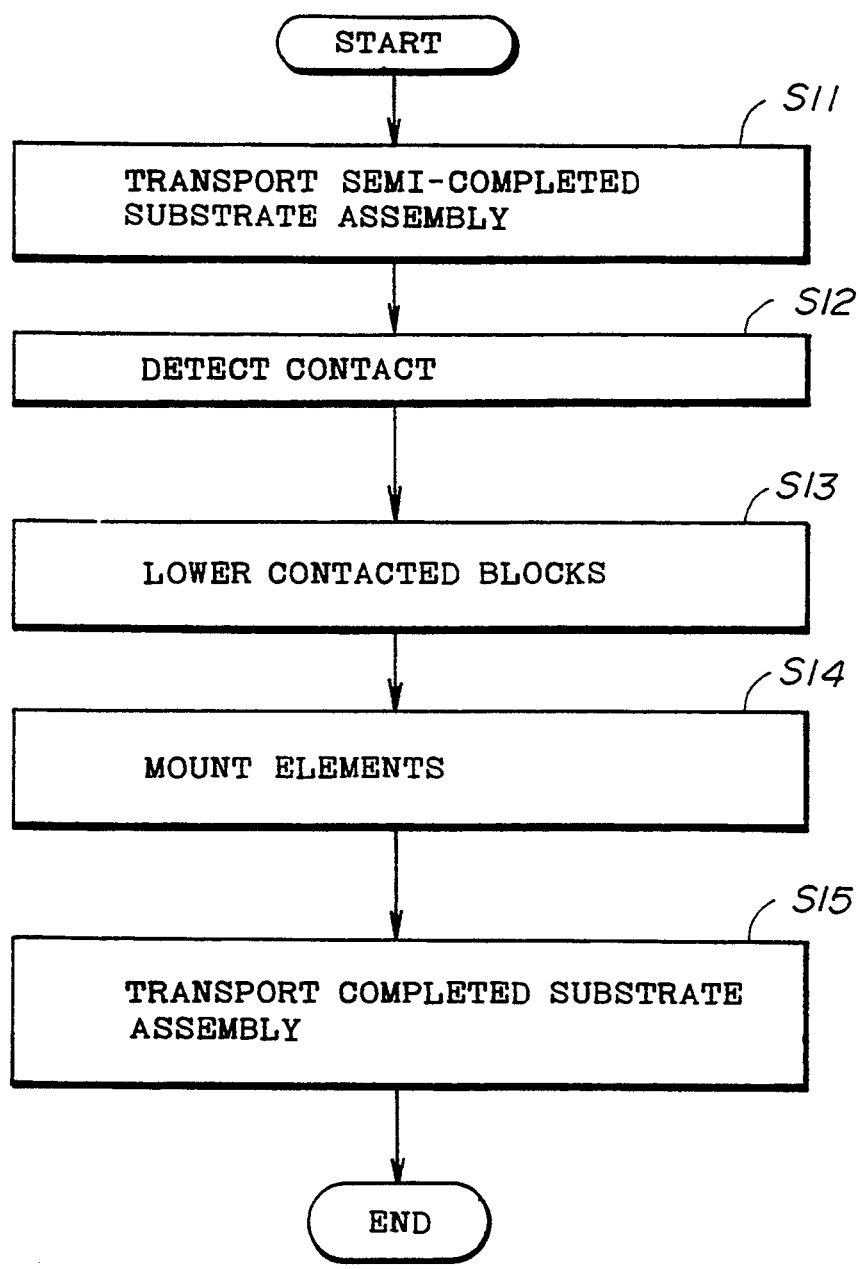
FIG. 16 is a flow chart for explaining the third embodiment of the method.

FIG. 16 generally shows the basic steps of the third embodiment of the method. The process shown in FIG. 16 is started by the control circuit 131 after the elements are mounted on the surface 3 of the substrate 2 and the semi-completed substrate assembly 140 is obtained, if it is assumed for the sake of convenience that the control circuit 131 forms a controller (not shown) which controls the entire process of producing the wire-bonded substrate assembly 20. However, if not, only steps S12, S14 and S15 are carried out by the control circuit 131 and other steps S11 and S13 are carried out by the controller.

In FIG. 16, the step S11 transports the semi-completed substrate assembly 140 to the position immediately above the work table 330. The step S12 detects those blocks which are contacted by the elements mounted on the surface 3 of the substrate 2 of the semi-completed substrate assembly 140 by receiving the sensor signals from the sensors. The step S13 lowers the contacted blocks based on the sensor signals, so that selected blocks support the surface 3 of the substrate 2 at parts avoiding parts where elements are mounted on the surface 3. The step S14 mounts elements on the surface 13 of the substrate 2. The mounting of the elements on the surface 13 includes the wire-bonding process. After the elements are mounted on the surface 13 of the substrate 2, the step S15 raises the lowered blocks and transports the completed wire-bonded substrate assembly 20 to the next stage.

The work table which is used in each of the above described embodiments may be used to carry out any arbitrary process on the surface of the substrate opposite to the surface of the substrate already having elements formed thereon. In addition, the method of the present invention may also be applied to the tape carrier bonding process.

Further, the present invention is not limited to these embodiments, but various variations and modifications may be made without departing from the scope of the present invention.

What is claimed is:

1. A method of producing a substrate assembly, comprising the steps of:
   (a) preparing a semi-completed substrate assembly by providing a substrate having a first surface and a second surface which is opposite to the first surface, and fixedly mounting a plurality of elements on the first surface of the substrate;
   (b) providing movable blocks and supporting the first surface of the substrate by said blocks under control means controlling movement of said blocks so that said blocks support said first surface at positions avoiding positions of the elements mounted on the first surface; and
   (c) carrying out a process on the second surface of the substrate to complete a substrate assembly.

2. A method of producing a substrate assembly, comprising the steps of:
   (a) preparing a semi-completed substrate assembly by providing a substrate having a first surface and a second surface which is opposite to the first surface, and fixedly mounting a plurality of elements on the first surface of the substrate;
   (b) supporting the first surface of the substrate at positions avoiding positions of the elements mounted on the first surface; and
   (c) carrying out a process on the second surface of the substrate to complete a substrate assembly, wherein said step (b) supports the first surface of the substrate using a work table which is made up of a plurality of blocks which are movable between raised and lowered positions and support the first surface firstly by selected ones of the blocks in the raised positions.

3. The method of producing the substrate assembly as claimed in claim 2, wherein said step (b) controls the position of each of the blocks depending on the positions of the elements mounted on the first surface of the substrate.

4. The method of producing the substrate assembly as claimed in claim 2, wherein the work table used by said step (b) is made up of the blocks which are arranged in an array.

5. A method of producing a substrate assembly, comprising the steps of:
   (a) preparing a semi-completed substrate assembly by providing a substrate having a first surface and a second surface which is opposite to the first surface, and mounting a plurality of elements on the first surface of the substrate;
   (b) providing movable blocks and supporting the first surface of the substrate by said blocks under control of control means controlling movement of said blocks so that said blocks support said first surface at positions avoiding positions of the elements mounted on the first surface; and
   (c) carrying out a process on the second surface of the substrate to complete a substrate assembly, said step (c) carrying out a process including mounting of elements on the second surface of the substrate.

6. The method of producing the substrate assembly as claimed in claim 5, wherein said step (c) mounts at least an element on the second surface of the substrate.

7. A method of producing a substrate assembly, comprising the steps of:
   (a) preparing a semi-completed substrate assembly by providing a substrate having a first surface and a second surface which is opposite to the first surface, and fixedly mounting a plurality of elements on the first surface of the substrate;
   (b) supporting the first surface of the substrate at positions avoiding positions of the elements mounted on the first surface; and
   (c) carrying out a process on the second surface of the substrate to complete a substrate assembly, wherein:
   said step (b) uses a work table which is made up of a plurality of blocks which are movable between raised and lowered positions and heaters built into the blocks to support the first surface directly by selected ones of the blocks in the raised positions, and
   said step (c) mounts at least one element on the second surface of the substrate by a die-bonding at a predetermined region of the second surface in a state where the predetermined region is heated by at least one of the heaters of the blocks in the raised positions.

8. The method of producing the substrate assembly as claimed in claim 7, wherein said step (c) mounts a resin encapsulated integrated circuit chip on the second surface of the substrate by mounting an integrated circuit chip at the predetermined region on the second surface of the substrate by a die-bonding, connecting wires on the integrated circuit chip by a wire-bonding, and encapsulating the integrated circuit chip by a synthetic resin.

9. The method of producing the substrate assembly as claimed in claim 7, wherein the elements mounted on the first and second surfaces of the substrate are selected from a group consisting of a resin encapsulated integrated circuit chip and a capacitor.

* * * * *